United States Patent
Wang et al.

(10) Patent No.: US 10,724,796 B2
(45) Date of Patent: Jul. 28, 2020

(54) FURNACE FOR CASTING NEAR-NET SHAPE (NNS) SILICON

(71) Applicant: Silfex, Inc., Eaton, OH (US)

(72) Inventors: Rong Wang, Springboro, OH (US); Haresh Siriwardane, Oakwood, OH (US); Vijay Nithiananthan, Springboro, OH (US)

(73) Assignee: SILFEX, INC, Eaton, OH (US)

( * ) Notice: Subject to any disclaimer, the term of this patent is extended or adjusted under 35 U.S.C. 154(b) by 141 days.

(21) Appl. No.: 15/988,155

(22) Filed: May 24, 2018

(65) Prior Publication Data

US 2019/0360750 A1    Nov. 28, 2019

(51) Int. Cl.
| | |
|---|---|
| *C30B 35/00* | (2006.01) |
| *F27B 14/14* | (2006.01) |
| *F27B 14/10* | (2006.01) |
| *F27B 14/20* | (2006.01) |
| *F27B 14/08* | (2006.01) |

(52) U.S. Cl.
CPC ............ *F27B 14/14* (2013.01); *C30B 35/002* (2013.01); *F27B 14/10* (2013.01); *F27B 14/20* (2013.01); *F27B 2014/0825* (2013.01); *F27B 2014/102* (2013.01); *F27B 2014/104* (2013.01)

(58) Field of Classification Search
CPC .......... F27B 9/36; B22D 27/04; C01B 33/02; C03B 20/00; C30B 28/06; C30B 28/10; C30B 29/06
See application file for complete search history.

(56) References Cited

U.S. PATENT DOCUMENTS

| | | |
|---|---|---|
| 8,177,910 B2 | 5/2012 | Schmid et al. |
| 2007/0227189 A1 | 10/2007 | Sakai |
| 2007/0283882 A1 | 12/2007 | Cho et al. |
| 2008/0217815 A1* | 9/2008 | Akopyan ............. B29C 45/53 264/314 |
| 2010/0197070 A1 | 8/2010 | Stoddard et al. |
| 2012/0312800 A1 | 12/2012 | Chartier et al. |

(Continued)

FOREIGN PATENT DOCUMENTS

JP    2012036043 A    2/2012

OTHER PUBLICATIONS

International Search Report and Written Opinion for PCT Application No. PCT/US2019/032656 dated Aug. 29, 2019.

(Continued)

*Primary Examiner* — Robert M Kunemund

(57) ABSTRACT

A furnace includes a pedestal, a crucible, first and second heaters, and a controller. The crucible is arranged on a pedestal that is movable downwardly and is rotatable. The first and second heaters are spaced vertically along an outer wall of the crucible and are arranged around the crucible to heat pieces of solid material deposited in the crucible. A third heater is arranged above the crucible if the crucible includes a solid cylindrical mold or in a hollow cylindrical space of the crucible if the crucible includes a hollow cylindrical mold. The controller is configured to control the first and second heaters to heat the pieces of the solid material to form a melted liquid. The controller is configured to control the rotational and downward movements of the pedestal relative to the first and second heaters during solidification of the melted liquid to form an ingot.

19 Claims, 11 Drawing Sheets

(56) References Cited

U.S. PATENT DOCUMENTS

2013/0133374 A1   5/2013   Ebi et al.
2015/0082833 A1   3/2015   Yagi et al.
2017/0058428 A1   3/2017   Yang et al.

OTHER PUBLICATIONS

C. P. Khattak and F. Schmid, Growth of Silicon Ingots by HEM for Photovoltaic Applications., pp. 153-183, Slicon Processing for Photovoltaics II, 1987.
Koichi Kakimoto, Crystallization of Silicon by a Directional Solidification Method, Crystal Growth of Si for Solar Cells, Advsmaterials, vol. 14, pp. 55-69, 2009.

* cited by examiner

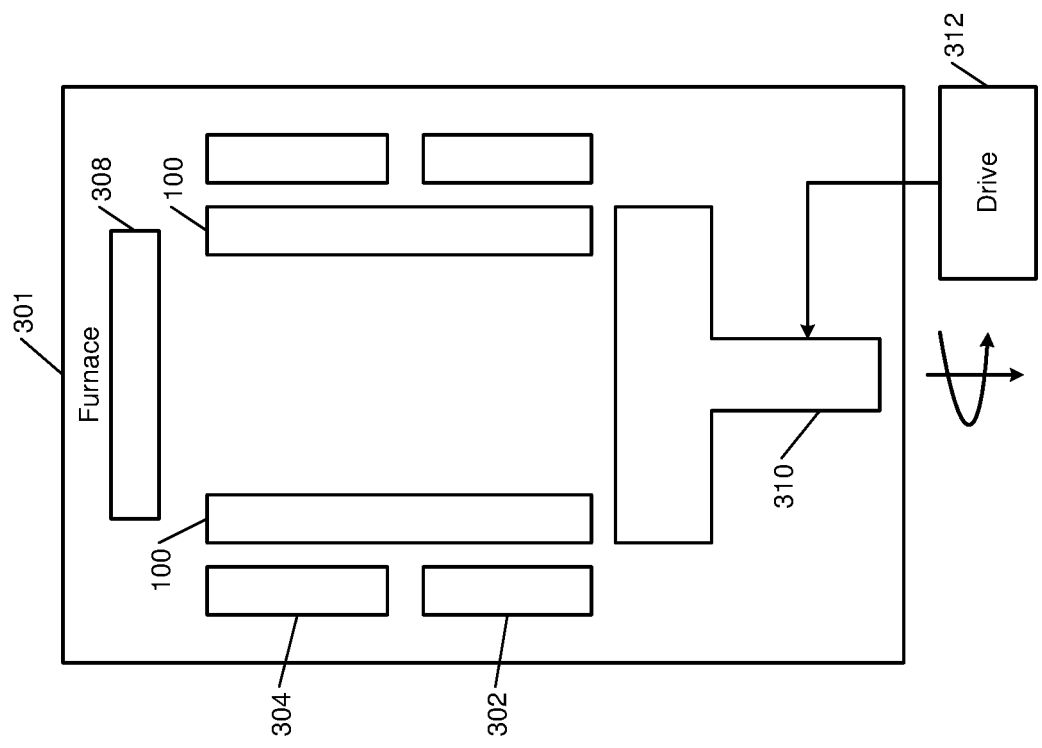
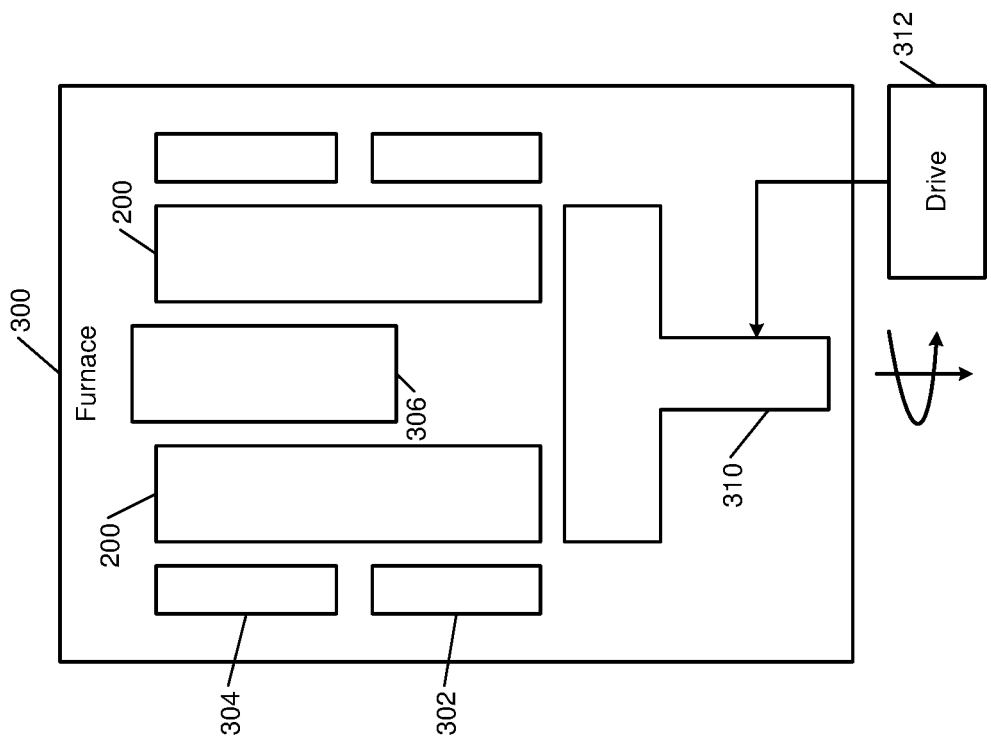

FURNACE FOR CASTING NEAR-NET SHAPE (NNS) SILICON

FIELD

The present disclosure relates generally to casting ingots and more particularly to a furnace for casting near-net shape (NNS) silicon ingots.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Square quartz crucibles are used to cast multi-crystalline silicon (Mc-Si). Casting silicon using the square quartz crucibles requires several additional processing steps to produce a final chamber part. These standard methods used to make chamber parts are costly due to the multiple process steps, the time involved in processing, and the material wasted during shaping.

Furnaces include heaters to melt solid silicon into liquid silicon in these crucibles. The furnaces may also include cooling systems to cool the molten silicon and to grow silicon ingots in these crucibles. The dimensions of the ingots that can be grown using these furnaces are generally limited due to the heating and cooling processes used in the furnaces during casting. The dimensions are also limited due to the inability of these furnaces to manage intrinsic thermal stresses that occur during the heating and cooling processes used.

SUMMARY

A furnace comprising a hollow mold arranged on a pedestal; first, second, and third heaters; and a controller. The hollow mold is formed between an inner cylindrical wall and an outer cylindrical wall. The first heater is arranged in a hollow cylindrical space extending along an inner wall of the inner cylindrical wall to heat pieces of a solid material deposited in the hollow mold. The second and third heaters are spaced vertically along an outer wall of the outer cylindrical wall and are arranged around the outer cylindrical wall to heat the pieces of the solid material deposited in the hollow mold. The pedestal is configured to rotate at a first speed and to move downward at a second speed relative to the first, second, and third heaters. The controller is configured to control the first, second, and third heaters to heat the pieces of the solid material to form a melted liquid. The controller is configured to control the first and second speeds of the pedestal during solidification of the melted liquid to form an ingot from the melted liquid.

In other features, the furnace further comprises an insulation. The insulation comprises a circumference wall surrounding the outer cylindrical wall of the hollow mold; a top cover mounted on the circumference wall; and a bottom cover coupled to the pedestal and configured to move vertically with the pedestal.

In other features, the inner cylindrical wall and the outer cylindrical wall are made of quartz; and an inner portion of the outer cylindrical wall and an outer portion of the inner cylindrical wall are coated with silicon nitride.

In other features, the solid material includes silicon, silicon carbide, or a non-oxide ceramic; and the solid material is selectively doped with a dopant.

In other features, the furnace further comprises at least one temperature sensor associated with the hollow mold to sense a temperature of contents of the hollow mold. The controller controls the first, second, and third heaters and the first and second speeds of the pedestal based on the sensed temperature.

In still other features, a furnace comprises a cylindrical mold arranged on a pedestal; a cup surrounding the cylindrical mold; first, second, and third heaters; and a controller. The first heater is arranged above the cylindrical mold to heat pieces of a solid material deposited in the cylindrical mold. The second and third heaters are spaced vertically along an outer wall of the cup and are arranged around the cup to heat the pieces of the solid material deposited in the cylindrical mold. The pedestal is configured to rotate at a first speed and to move downward at a second speed relative to the first, second, and third heaters. The controller is configured to control the first, second, and third heaters to heat the pieces of the solid material to form a melted liquid. The controller is configured to control the first and second speeds of the pedestal during solidification of the melted liquid to form an ingot from the melted liquid.

In other features, the furnace further comprises an insulation. The insulation comprises a circumference wall surrounding the cup; a top cover mounted on the circumference wall; and a bottom cover coupled to the pedestal and configured to move vertically with the pedestal.

In other features, the cylindrical mold is made of quartz; the cup is made of graphite; and an inner wall of the cylindrical mold is coated with silicon nitride.

In other features, the solid material includes silicon, silicon carbide, or a non-oxide ceramic; and the solid material is selectively doped with a dopant.

In other features, the furnace further comprises at least one temperature sensor associated with the cylindrical mold to sense a temperature of contents of the cylindrical mold. The controller controls the first, second, and third heaters and the first and second speeds of the pedestal based on the sensed temperature.

In still other features, a furnace comprises an insulation, a pedestal, a crucible, first and second heaters, and a controller. The insulation comprises a circumference wall; a top cover mounted on the circumference wall; and a bottom cover movable vertically relative to the circumference wall. The pedestal is coupled to the bottom cover. The pedestal is movable downwardly with the bottom cover and is rotatable. The crucible is arranged on the pedestal. The first and second heaters are spaced vertically along an outer wall of the crucible and are arranged around the crucible to heat pieces of solid material deposited in the crucible, the circumference wall surrounding the first and second heaters. The controller is configured to control the first and second heaters to heat the pieces of the solid material to form a melted liquid. The controller is configured to control rotational and downward movements of the pedestal relative to the first and second heaters during solidification of the melted liquid to form an ingot from the melted liquid.

In other features, the crucible comprises a cylindrical mold surrounded by a cup.

In other features, the cylindrical mold is made of quartz; the cup is made of graphite; and an inner wall of the cylindrical mold is coated with silicon nitride.

In other features, the furnace further comprises a third heater that is arranged above the crucible and that is controlled by the controller to heat the pieces of the solid material deposited in the crucible.

In other features, the crucible comprises a hollow mold formed between an inner cylindrical wall and an outer cylindrical wall.

In other features, the inner cylindrical wall and the outer cylindrical wall are made of quartz; and an inner portion of the outer cylindrical wall and an outer portion of the inner cylindrical wall are coated with silicon nitride.

In other features, the furnace further comprises a third heater that is arranged in a hollow cylindrical space extending along an inner wall of the inner cylindrical wall and that is controlled by the controller to heat the pieces of the solid material deposited in the crucible.

In other features, the solid material includes silicon, silicon carbide, or a non-oxide ceramic; and the solid material is selectively doped with a dopant.

In other features, the furnace further comprises at least one temperature sensor associated with the crucible to sense a temperature of contents of the crucible. The controller controls the first and second heaters and the rotational and downward movements of the pedestal based on the sensed temperature.

In still other features, a method for forming an ingot in a furnace comprises arranging, on a pedestal in the furnace, a hollow mold formed between an inner cylindrical wall and an outer cylindrical wall. The method further comprises arranging, in the furnace, a first heater in a hollow cylindrical space, the first heater extending along an inner wall of the inner cylindrical wall to heat pieces of a solid material deposited in the hollow mold. The method further comprises arranging, in the furnace, second and third heaters spaced vertically along an outer wall of the outer cylindrical wall and around the outer cylindrical wall to heat the pieces of the solid material deposited in the hollow mold. The method further comprises configuring the pedestal to rotate at a first speed and to move downward at a second speed relative to the first, second, and third heaters. The method further comprises controlling the first, second, and third heaters to heat the pieces of the solid material to form a melted liquid. The method further comprises controlling the first and second speeds of the pedestal during solidification of the melted liquid to form the ingot from the melted liquid.

In other features, the method further comprises forming the inner cylindrical wall and the outer cylindrical wall from quartz; and coating an inner portion of the outer cylindrical wall and an outer portion of the inner cylindrical wall with silicon nitride.

In other features, the solid material includes silicon, silicon carbide, or a non-oxide ceramic; and the method further comprises doping the solid material with a dopant.

In other features, the method further comprises sensing a temperature of contents of the hollow mold; and controlling the first, second, and third heaters and the first and second speeds of the pedestal based on the sensed temperature.

In still other features, a method for forming an ingot in a furnace comprises arranging, on a pedestal in the furnace, a cylindrical mold surrounded by a cup. The method further comprises arranging, in the furnace, a first heater above the cylindrical mold to heat pieces of a solid material deposited in the cylindrical mold. The method further comprises arranging, in the furnace, second and third heaters spaced vertically along an outer wall of the cup and around the cup to heat the pieces of the solid material deposited in the cylindrical mold. The method further comprises configuring the pedestal to rotate at a first speed and to move downward at a second speed relative to the first, second, and third heaters. The method further comprises controlling the first, second, and third heaters to heat the pieces of the solid material to form a melted liquid. The method further comprises controlling the first and second speeds of the pedestal during solidification of the melted liquid to form the ingot from the melted liquid.

In other features, the method further comprises forming the cylindrical mold from quartz; forming the cup from graphite; and coating an inner wall of the cylindrical mold with silicon nitride.

In other features, the solid material includes silicon, silicon carbide, or a non-oxide ceramic; and the method further comprises doping the solid material with a dopant.

In other features, the method further comprises sensing a temperature of contents of the cylindrical mold; and controlling the first, second, and third heaters and the first and second speeds of the pedestal based on the sensed temperature.

In still other features, a method for forming an ingot in a furnace comprises arranging, in the furnace, an insulation comprising a circumference wall; a top cover mounted on the circumference wall; and a bottom cover movable vertically relative to the circumference wall. The method further comprises configuring a pedestal coupled to the bottom cover to move downwardly with the bottom cover and to rotate. The method further comprises arranging a crucible on the pedestal. The method further comprises arranging, in the furnace, first and second heaters spaced vertically along an outer wall of the crucible and around the crucible to heat pieces of solid material deposited in the crucible, the circumference wall surrounding the first and second heaters. The method further comprises controlling the first and second heaters to heat the pieces of the solid material to form a melted liquid. The method further comprises controlling rotational and downward movements of the pedestal relative to the first and second heaters during solidification of the melted liquid to form the ingot from the melted liquid.

In other features, the crucible comprises a cylindrical mold surrounded by a cup, and the method further comprises forming the cylindrical mold from quartz; forming the cup from graphite; and coating an inner wall of the cylindrical mold with silicon nitride.

In other features, the method further comprises arranging a third heater above the crucible; and controlling the third heater to heat the pieces of the solid material deposited in the crucible.

In other features, the crucible comprises a hollow mold formed between an inner cylindrical wall and an outer cylindrical wall, and the method further comprises forming the inner cylindrical wall and the outer cylindrical wall from quartz; and coating an inner portion of the outer cylindrical wall and an outer portion of the inner cylindrical wall with silicon nitride.

In other features, the method further comprises arranging a third heater in a hollow cylindrical space extending along an inner wall of the inner cylindrical wall; and controlling the third heater to heat the pieces of the solid material deposited in the crucible.

In other features, the solid material includes silicon, silicon carbide, or a non-oxide ceramic; and the method further comprises doping the solid material with a dopant.

In other features, the method further comprises sensing a temperature of contents of the crucible; and controlling the first and second heaters and the rotational and downward movements of the pedestal based on the sensed temperature.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3A shows a schematic of a first furnace including three heaters and a movable pedestal that uses the second cylindrical crucible of FIGS. 2A-2B to produce hollow cylindrical ingots;

FIG. 3B shows a schematic of a second furnace including three heaters and a movable pedestal that uses the first cylindrical crucible of FIGS. 1A-1B to produce solid cylindrical ingots;

In the drawings, reference numbers may be reused to identify similar and/or identical elements.

DETAILED DESCRIPTION

Briefly, the present disclosure relates to furnaces comprising multiple heaters for growing solid and hollow ingots. When casting a solid cylindrical ingot using a cylindrical crucible, two side heaters and one top heater surrounding the crucible are used. When casting a hollow cylindrical ingot using a hollow cylindrical crucible, the two side heaters are used, and the third heater is placed in the hollow region of the crucible instead of on top of the crucible.

When melting solid silicon in a crucible placed in a furnace, these heaters are controlled to initially generate more heat at the bottom of the crucible than at the top of the crucible. After the un-melted solid silicon floats on the partly molten silicon, the heaters are controlled to generate more heat at the top of the crucible than at the bottom of the crucible (i.e., the temperature gradient is reversed).

When cooling the molten silicon, a constant temperature gradient is maintained through the molten silicon by controlling the heaters and by moving the crucible downward and away from the heaters at a controlled rate. The crucible is also rotated (spun) around its axis at a controlled rate while moving the crucible downward and away from the heaters.

Unlike in conventional processes, the above process ensures that an angle of incidence (viewing angle) from the main side heater to a solidification front in the crucible (i.e., an interface between solidifying and molten silicon) remains unchanged. Unexpectedly, this process allows growing ingots up to 600 mm high without any intrinsic stresses or defects that occur in the conventional processes, which is more than the height of about 350 mm achievable using the conventional processes. It should be noted that 600 mm is only a non-limiting example.

The furnace according to the present disclosure comprises a heating assembly; an insulation comprising a circumference wall, a top insulation cover mounted to the circumference wall, and a bottom insulation cover being openable by lowering the bottom insulation cover. The furnace further comprises a crucible for receiving material to be melted therein (the material preferably being silicon) and a liftable (i.e., vertically movable) carrier holding the crucible. The crucible is preferably made of quartz. The crucible is surrounded by a cup in order to avoid deformation of the crucible. The cup is preferably made of graphite. The lower insulation cover is mounted to the liftable carrier to be lowered and is lifted up/down together with the cup. The heating assembly comprises at least two separately controllable heaters: a top heater heating the top of the material and two separately controllable side heaters. In an embodiment, in addition to the two separately controllable side heaters, a central heater is inserted into a hollow crucible for growing a hollow ingot. These and other aspects of the present disclosure are described below in detail.

Figure 8:
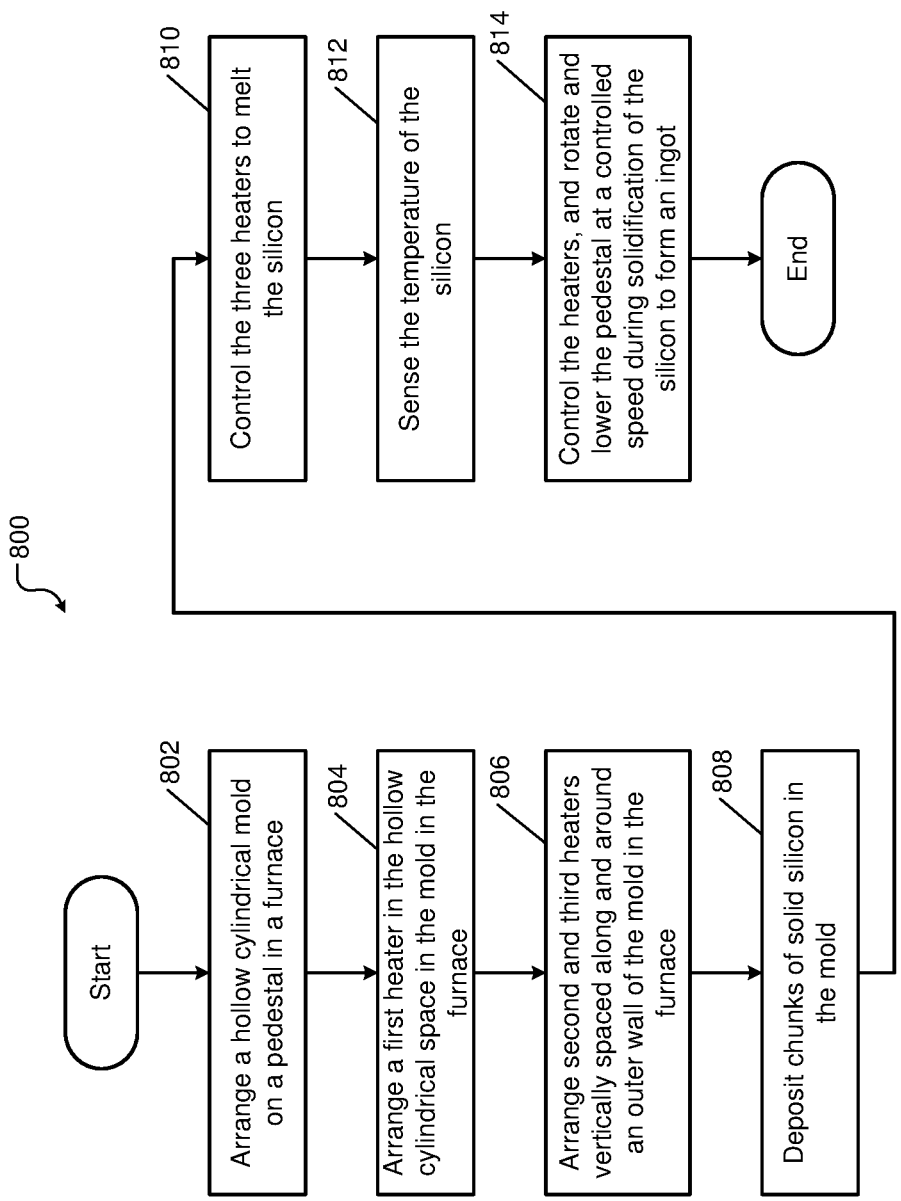
FIG. 8 shows a method for forming a hollow cylindrical ingot using the second cylindrical crucible of FIGS. 2A-2B in the first furnace of FIG. 3A and employing the second method of cooling molten silicon shown in FIGS. 5A-5C.
Figure 9:
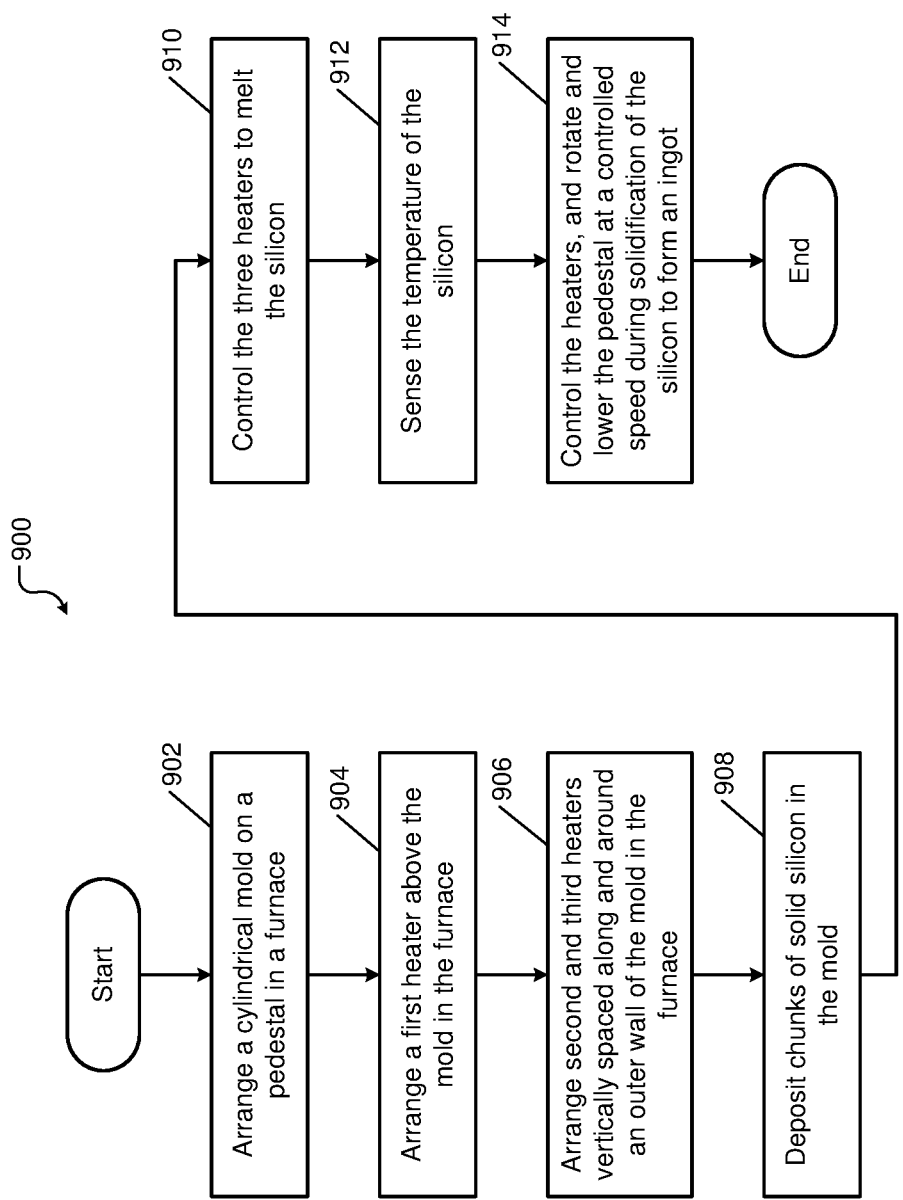
FIG. 9 shows a method for forming a solid cylindrical ingot using the first cylindrical crucible of FIGS. 1A-1B in the second furnace of FIG. 3B and employing the second method of cooling molten silicon shown in FIGS. 5D-5F.

The present disclosure is organized as follows. Crucibles for producing solid and hollow cylindrical ingots are described with reference to FIGS. 1A-2B. Furnaces with three-stage heaters and a movable pedestal with associated controls for producing the solid and hollow cylindrical ingots are described with reference to FIGS. 3A-3D. A furnace without any of the three-stage heaters, the movable pedestal, and associated controls, and with a corresponding method of producing the solid cylindrical ingots of a limited height are described with reference to FIGS. 4A-4C. The furnaces with the three-stage heaters, the movable pedestal, and associated controls along with a corresponding method of producing taller solid and hollow cylindrical ingots are described with reference to FIGS. 5A-5F. The temperature distributions in the feedstock during melting of silicon in the furnaces of FIGS. 3A-3B and 5A-5F are described with reference to FIGS. 6A and 6B. The temperature distributions in the feedstock during melting of silicon in the furnaces of FIGS. 4A-4C are described with reference to FIG. 7. FIGS. 8 and 9 show methods for forming solid and hollow cylindrical ingots using the solid and cylindrical crucibles of FIGS. 1A-1B in the furnaces of FIGS. 3A-3B and employing the method of cooling molten silicon shown in FIGS. 5A-5F.

Figure 1B:
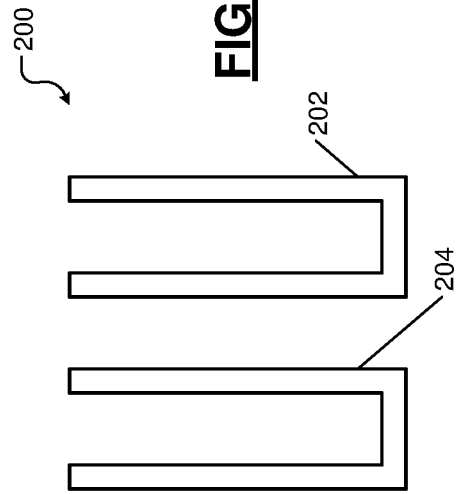
FIGS. 1A and 1B respectively show a plan view and a cross-section of a first cylindrical crucible used to produce solid cylindrical ingots.
Figure 1A:
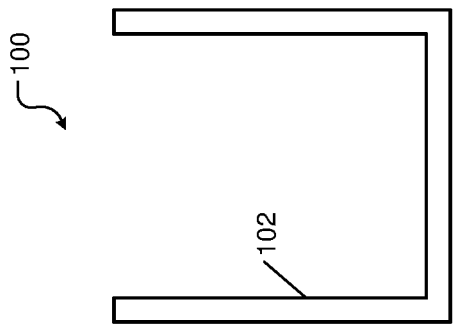

FIGS. 1A and 1B respectively show a plan view and a cross-section of a cylindrical crucible 100. The cylindrical crucible 100 is used to produce a solid cylindrical ingot. Chunks of solid silicon (with or without a dopant) are deposited in the cylindrical crucible 100. The cylindrical crucible 100 is placed in a furnace (e.g., furnace 301 shown in FIGS. 3B, 5A-5C, and 6A). The solid silicon is melted and cooled in the furnace to form a cylindrical ingot as explained below with reference to FIGS. 3A-3D, 5A-5C, and 6A.

The melted silicon is cooled from the bottom of the cylindrical crucible 100, which causes solidification of the melted silicon from the bottom of the cylindrical crucible 100 in an upwardly direction as explained below with reference to FIGS. 3A-3D, 5A-5C, and 6A. The cylindrical crucible 100 is generally made of quartz and is surrounded by a cup generally made of graphite. The coefficient of thermal expansion (CTE) of quartz is one order less than the CTE of silicon. During solidification, silicon can attach to quartz. To prevent silicon from attaching to quartz, an inner wall 102 of the cylindrical crucible 100 is coated with silicon nitride.

Figure 2B:
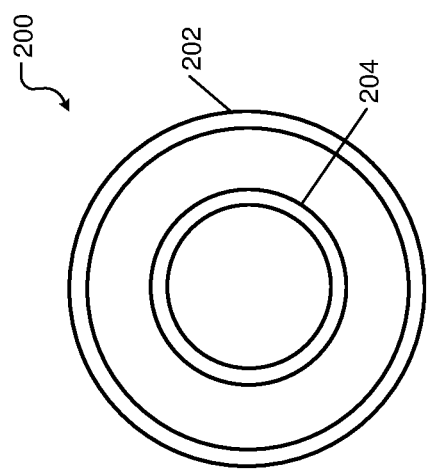
FIGS. 2A and 2B respectively show a plan view and a cross-section of a second cylindrical crucible used to produce hollow cylindrical ingots.
Figure 2A:
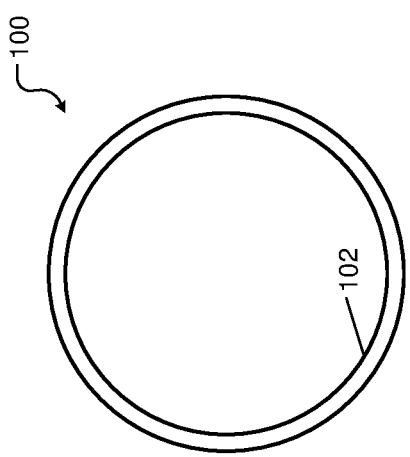

FIGS. 2A and 2B respectively show a plan view and a cross-section of a cylindrical crucible 200. A hollow cylindrical mold is formed between an inner wall 202 and an outer wall 204 of the cylindrical crucible 200. The inner and outer walls 202, 204 are joined at the bottom of the cylindrical crucible 200. The cylindrical crucible 200 is used to produce a cylindrical ingot that is hollow in the center. Chunks of solid silicon (with or without a dopant) are deposited in the hollow mold. The cylindrical crucible 200 is placed in a furnace (e.g., furnace 300 shown in FIGS. 3A, 5D-5F, and 6B). The solid silicon is melted and cooled in the furnace to form a cylindrical ingot as explained below with reference to FIGS. 3A-3D, 5D-5F, and 6B.

The melted silicon is cooled from the bottom of the cylindrical crucible 200, which causes solidification of the melted silicon from the bottom of the cylindrical crucible 200 in an upwardly direction as explained below with reference to FIGS. 3A-3D, 5D-5F, and 6B. The cylindrical crucible 200 is generally made of quartz and is surrounded by a cup generally made of graphite. To prevent silicon from attaching to quartz, an inner portion of the outer wall 204 and an outer portion of the inner wall 202 are coated with silicon nitride.

Generally, in molding and casting systems, one of two types of solidifications can occur. A first type of solidification is called a directional solidification, which is a type of solidification that occurs from a farthest end of a cast and works its way towards a sprue, where a sprue is a passage through which a molten material is introduced into a mold. A second type of solidification is called progressive solidification, also called parallel solidification, which is a type of solidification that starts at the walls of the casting and progresses perpendicularly from that surface. In the present disclosure, the directional solidification is used for producing ingots and is called a directional solidification system (DSS).

Figure 3D:
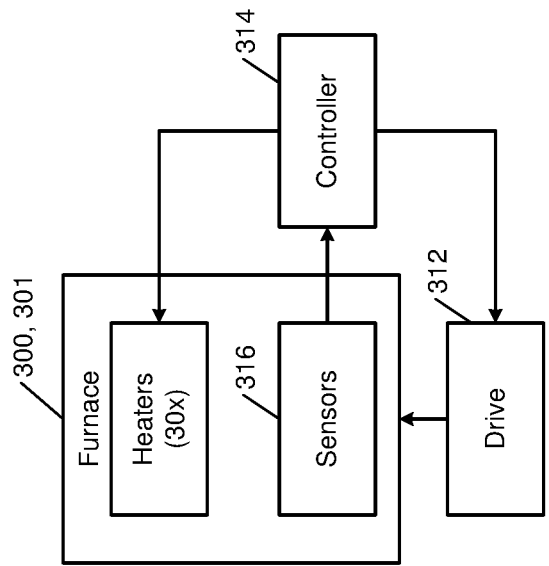
FIG. 3D shows a functional block diagram of a controller that controls a drive that rotates and vertically moves the pedestal and that controls the heaters in the first and second furnaces of FIGS. 3A-3B.

FIGS. 3A-3D schematically show the furnaces 300 and 301 according to the present disclosure. FIG. 3A shows a schematic of a cross-section of the furnace 300. The cylindrical crucible 200 shown in FIGS. 2A and 2B is used in the furnace 300. The furnace 300 uses three heaters 302, 304, and 306 to produce a hollow cylindrical ingot using the cylindrical crucible 200. The heaters 302 and 304 are arranged around the cylindrical crucible 200 near the bottom and top portions of the cylindrical crucible 200, respectively. The third heater 306 arranged in the central hollow portion of the cylindrical crucible 200.

FIG. 3B shows a schematic of a cross-section of the furnace 301. The cylindrical crucible 100 shown in FIGS. 1A and 1B is used in the furnace 301. The furnace 301 uses three heaters 302, 304, and 308 to produce a solid cylindrical ingot using the cylindrical crucible 100. The heaters 302 and 304 are arranged around the cylindrical crucible 100 near the bottom and top portions of the cylindrical crucible 100, respectively. The third heater 308 arranged on top of the cylindrical crucible 100.

Specifically, the first heater 302 in the furnaces 300 and 301 is arranged on the side of the cylindrical crucibles 100 and 200, is closer to the bottom of the cylindrical crucibles 100 and 200, and is generally called the bottom heater 302 or the bottom side heater 302. The second heater 304 in the furnaces 300 and 301 is also arranged on the side of the cylindrical crucibles 100 and 200, is arranged closer to the top of the cylindrical crucibles 100 and 200, and is generally called the top side heater 304.

The third heater 306 in the furnace 300 is arranged in the central hollow portion of the cylindrical crucible 200 and may be called the center heater 306. The third heater 308 in the furnace 301 is arranged on top of the cylindrical crucible 100 and may be called the top heater 308. It should be noted that the dimensions of the heaters 302, 304, 306, and 308 are not to scale. Only the positions (locations) of the heaters 302, 304, 306, and 308 are of significance.

In FIG. 3A, the cylindrical crucible 200 is placed on a pedestal 310 in the furnace 300. A drive 312 including a plurality of motors (not shown) is coupled to the pedestal 310. During the cooling process (i.e., when the molten silicon is cooled and the ingot grows in the cylindrical crucible 200), the drive 312 rotates (spins) the pedestal 310 around its axis. The drive 312 also moves the pedestal 310 downward and away from the heaters 302, 304, and 306 as described below.

In FIG. 3B, the cylindrical crucible 100 is placed on the pedestal 310 in the furnace 301. The drive 312 including a plurality of motors (not shown) is coupled to the pedestal 310. During the cooling process (i.e., when the molten silicon is cooled and the ingot grows in the cylindrical crucible 100), the drive 312 rotates (spins) the pedestal 310 around its axis. The drive 312 also moves the pedestal 310 downward and away from the heaters 302, 304, and 308 as described below.

Figure 3C:
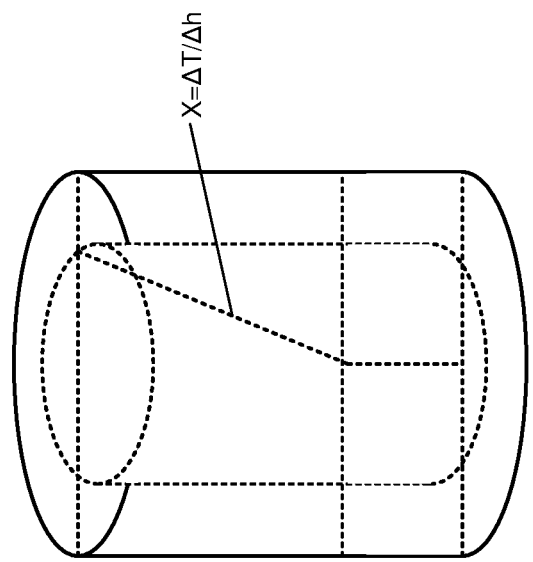
FIG. 3C schematically illustrates a temperature gradient in the first and second crucibles.
Figure 4C:
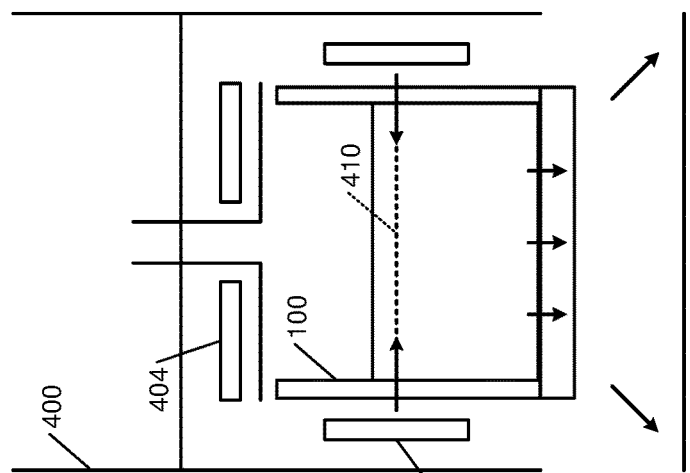
FIGS. 4A-4C show a third furnace with two heaters and without a movable pedestal and show a first method of cooling molten silicon when the first crucible of FIGS. 1A-1B is used in the third furnace.
Figure 4B:
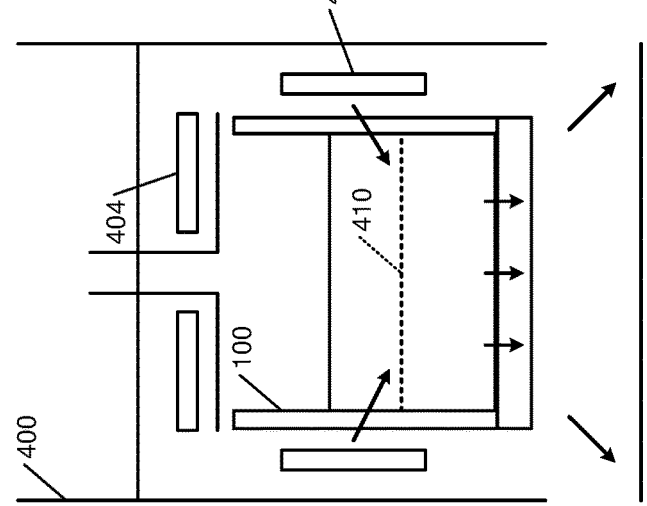
Figure 4A:
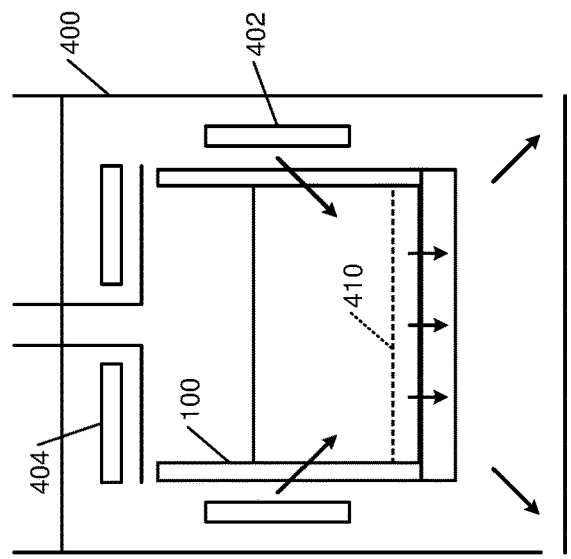

FIG. 3C schematically illustrates a temperature gradient in the crucible (100 or 200). For example, the temperature gradient can be expressed as $X=\Delta T/\Delta h$, where T denotes a temperature of silicon, and h denotes a height of silicon in the crucible (100 or 200). To maintain directional solidification of the molten silicon, the value of X is maintained below a fixed value by a controller 314 shown in FIG. 3D. The fixed value is a function of the material used to form the ingot (e.g., silicon, any dopant used with silicon, etc.) and the dimensions (e.g., height, diameter, etc.) of the ingot. The temperature gradient is controlled by controlling the heat generated by (i.e., power supplied to) the heaters 302, 304, and 306 (or 308) using the controller 314 as explained below.

FIG. 3D shows the controller 314 that controls the drive 312 and the heaters 302, 304, 306, and 308. One or more sensors 316 may be arranged in the furnace 300 (or 301) to sense various parameters associated with the production of the ingot. For examples, the sensors 316 may sense and supply data regarding the various parameters including the temperature of silicon at various stages of melting and cooling in the crucible (100 or 200); the heat supplied by the heaters 302, 304, and 306 (or 308); the amount of power supplied to the heaters 302, 304, and 306 (or 308); the speeds at which the drive 312 rotates and lowers the pedestal 310, and so on. The controller 314 receives the data from the sensors 316. Based on the data received from the sensors 316, the controller 314 controls the various parameters associated with the production of the ingot.

The process of forming the ingot begins with depositing chucks of solid silicon, along with any dopant if used, into the crucible (100 or 200). All three heaters 302, 304, and 306 (or 308) are turned on. Initially, the bottom heater 302 is set to supply more heat than the other two heaters 304 and 306 (or 308). Accordingly, the temperature near the bottom of the crucible is greater than the temperature near the top of the crucible. The solid silicon near the bottom of the crucible begins to melt into molten silicon. The solid silicon is less dense than the molten silicon. Therefore, the un-melted solid silicon floats on top of the partially molten silicon just as ice floats on top of the water that is formed when ice begins to melt.

Subsequently, to efficiently melt the remaining solid silicon that floats on the partially molten silicon, the bottom heater 302 is set to supply less heat than the other two heaters 304 and 306 (or 308). That is, the temperature gradient is reversed since the temperature near the top of the crucible is now greater than the temperature near the bottom of the crucible. Lowering the heat supplied from the bottom heater 302 is also consistent with (advantageous for) the cooling process performed after the entire solid silicon is melted, during which the molten silicon is cooled from the bottom to the top of the crucible.

Accordingly, the remaining solid silicon that floats on the partially molten silicon is melted by the heat supplied by the other two heaters 304 and 306 (or 308). As the solid silicon at the top melts, the molten silicon descends. Any un-melted solid silicon continues to float on top until all of the remaining solid silicon is completely melted by the heat supplied by the other two heaters 304 and 306 (or 308). The drive 312 may spin the pedestal 310 at a controlled speed during the entire melting process.

After all of the solid silicon is melted, the molten silicon is cooled from the bottom of the crucible to grow the ingot from the bottom to the top of the crucible. The drive 312 begins the cooling process by lowering the pedestal 310 at a controlled rate. The heaters 302, 304, and 306 (or 308) are also controlled during the cooling process as explained below with reference to FIGS. 5A-5F. By controlling the speed of lowering the pedestal 310 and controlling the heaters 302, 304, and 306 (or 308), an ingot that is much taller (nearly 600 mm) and that is free of any defects can be produced. These dynamics of the cooling process are further explained below.

FIGS. 4A-4C show a first method of cooling molten silicon in a furnace 400. The furnace 400 uses only two heaters: a side heater 402 and a top heater 404. FIGS. 4A-4C show the furnace 400 with the cylindrical crucible 100.

In the first method, the relative position of the heaters 402, 404 to the molten silicon does not change. The heaters 402, 404 are in a fixed position, and the molten silicon (the crucible) is also in a fixed position. Therefore, the temperature gradient along the height of the crucible changes as the molten silicon cools and the ingot grows in the crucible. The temperature gradient is high when an interface (also called solidification front) 410 between the molten silicon and the solid silicon is low in the beginning of the melting process as shown in FIG. 4A.

As the molten silicon cools and ingot grows in the crucible, the interface 410 rises as shown in FIGS. 4B-4C, and the temperature gradient decreases, which limits the height of the ingot that can be grown without defects (e.g., to about 350 mm). Note that the angle of incidence (also called view angle) from the side heater 402 to the interface 410 changes as the molten silicon cools, the ingot grows, and the interface 410 rises. The changing angle is shown in FIGS. 4A-4C.

Accordingly, FIGS. 4A-4C show a DSS casting process that has only one-stage control of the side and top heaters 402, 404, with the insulation of the furnace 400 moving in one direction. The view angle of the solidification front 410 from the side heater 402 changes from vertical to horizontal direction during solidification, which contributes to loss of vertical temperature gradient causing poor material strength and limiting ingot height.

Figure 5A:
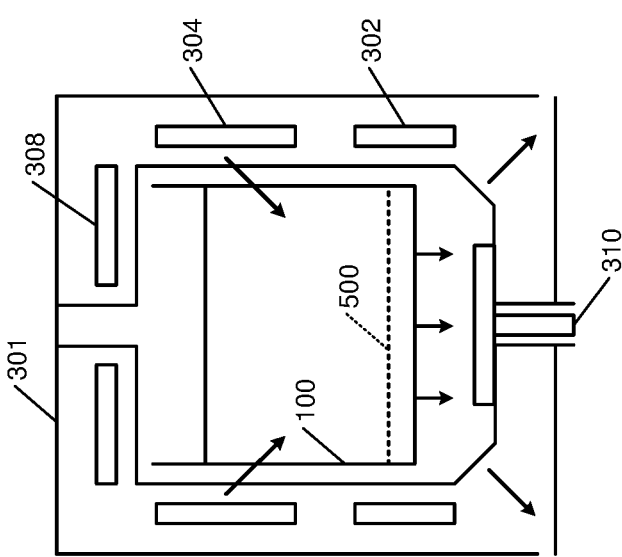
FIGS. 5A-5C show a second method of cooling molten silicon when the first crucible of FIGS. 1A-1B is used in the second furnace of FIG. 3B.
Figure 5B:
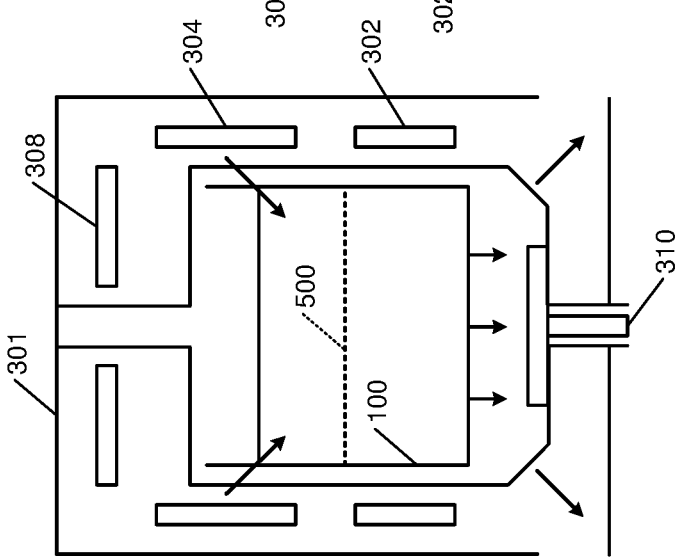
Figure 5C:
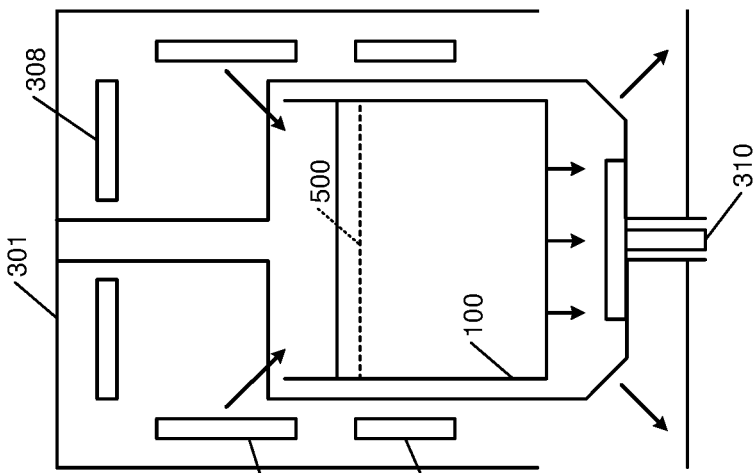
Figure 5F:
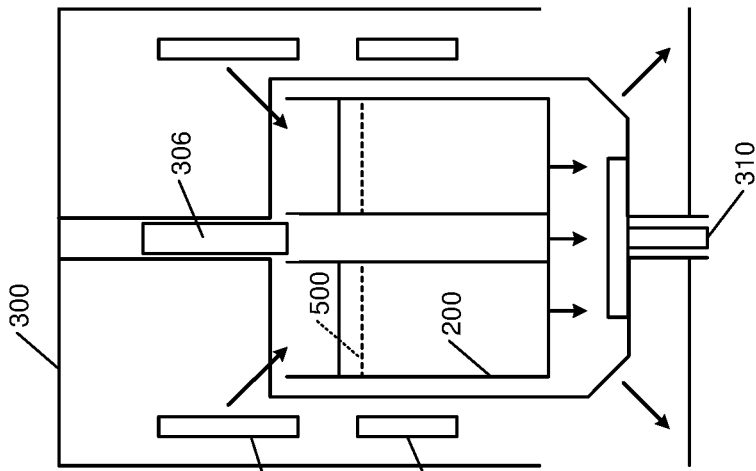
FIGS. 5D-5F show the second method of cooling molten silicon when the second crucible of FIGS. 2A-2B is used in the first furnace of FIG. 3A.
Figure 5E:
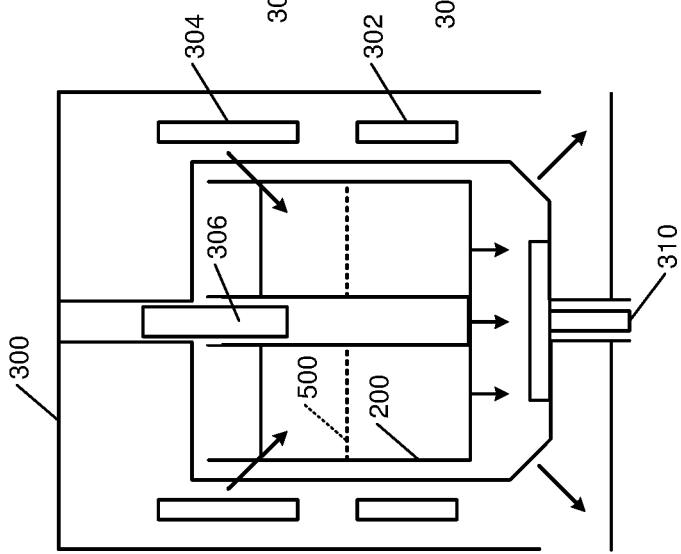
Figure 5D:
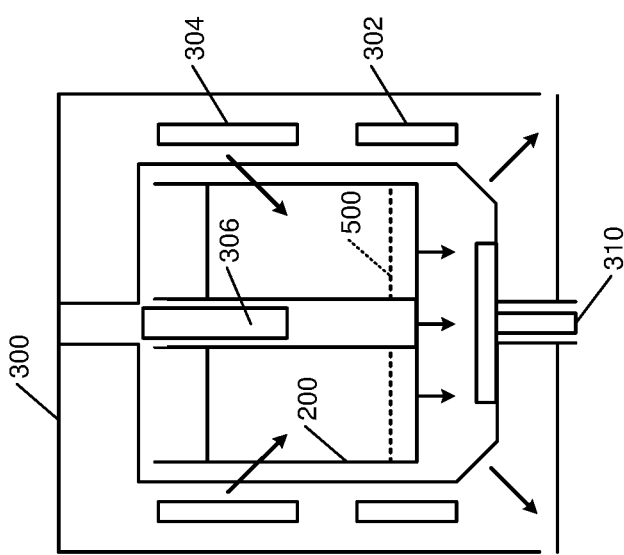

FIGS. 5A-5F show a second method of cooling molten silicon in the furnaces 300, 301. In FIGS. 5A-5C, the furnace 301 includes the cylindrical crucible 100 and the three heaters 302, 304, and 308. In FIGS. 5D-5F, the furnace 300 includes the cylindrical crucible 200 and the three heaters 302, 304, and 306.

The furnaces 300, 301 include an insulation comprising a circumference wall, a top cover mounted on the circumference wall, and a bottom cover movable vertically relative to the circumference wall. The pedestal 310 is coupled to the bottom cover and is movable downwardly with the bottom cover and is rotatable.

In the second method, the crucible (100 or 200) is moved downward relative to the heaters 302, 304, and 306 (or 308). Two controls are operative: First, one or more ratios of heat supplied by the three heaters 302, 304, and 306 (or 308) is controlled by the controller 314. By turning off or turning down the bottom heater 302, a temperature gradient is established by the controller 314. Second, the crucible is lowered relative to the heaters 302, 304, and 306 (or 308). The rate of lowering the crucible is controlled by the controller 314 such that the view angle from the top side heater 304 to the interface 500 is maintained constant, which yields a constant temperature gradient and allows growing taller (nearly 600 mm long) ingots. The rate of lowering the crucible and the rate of solidification of the molten silicon are synchronized by the controller 314. Due to the synchronization, the view angle from the top side heater 304 to the interface 500 remains constant throughout the cooling process and the growth of the ingot.

The rate of solidification (the rate at which the interface 500 rises during cooling and growth) is determined empirically in the factory as follows. For example, a probe is periodically suspended from the top center of the furnace (300, 301) into the crucible (100, 200) to detect the position of the interface 500 by melting and cooling silicon in the factory. The position of the crucible (i.e., the position of the pedestal 310) and the ratios of heat supplied by the heaters 302, 304, and 306 (or 308) are adjusted using the controller 314 to maintain the position of the interface 500 such that the view angle from the top side heater 304 angle to the interface 500 remains constant throughout the cooling of the molten silicon and the growth of the ingot. The rate of lowering the pedestal 310 and the ratios of the heat supplied by the heaters 302, 304, and 306 (or 308) used during the growth are programmed into the controller 314. Subsequently, during the production of ingots, the controller 314 automatically controls the pedestal 310 and the heaters 302, 304, and 306 (or 308) based on the programmed data.

The second method of producing ingots shown in FIGS. 5A-5E is better than the first method shown in FIGS. 4A-4C for the following reasons. In directional solidification systems (DSS), to grow an ingot, a positive temperature gradient (a higher temperature near the top than near the bottom of the crucible) is used. In the first method shown in FIGS. 4A-4C, the heaters 402, 404 and the crucible (100) do not move, and the temperature gradient is constant throughout the melting and cooling processes (i.e., ingot formation) in the first method.

However, a constant temperature gradient is not useful for efficiently melting the silicon. This is because solid silicon, which is less dense than liquid silicon, begins floating above the liquid silicon during the melting process as explained above. In the second method shown in FIGS. 5A-5E, to efficiently melt silicon, at the start of the melting process, the bottom heater 302 is turned on with a higher heat setting than the other heaters 304 and 306 (or 308) near the top of the crucible so that un-melted solid silicon begins to float above the partially molten silicon. That is, a negative temperature gradient is initially established. The first method does not achieve the negative temperature gradient due to the constant positive temperature gradient used to grow the ingot. Accordingly, melting solid silicon using the first method takes relatively long time and is inefficient.

In contrast, in the second method shown in FIGS. 5A-5E, after the un-melted solid silicon begins to float on the partially melted liquid silicon, the bottom heater 302 is turned off or turned down (i.e., heat supplied by the bottom heater 302 is reduced to a lower value or to zero). The other heaters 304 and 306 (or 308) near the top of the crucible are turned up or set to supply more heat than the bottom heater 302 (i.e., the temperature gradient is reversed from negative to positive) to melt the silicon floating on top of the partially molten silicon. This accelerates the melting process.

After all the silicon is melted, the positive temperature gradient is maintained constant by controlled lowering of the crucible and by adjusting the heat ratios of the heaters 302, 304, and 306 (or 308) in synchronization with the controlled lowering of the crucible. Thus, in the second method shown in FIGS. 5A-5E, the temperature gradient is not only changed (reversed) to efficiently melt silicon but is also subsequently maintained constant to grow the ingot using directional solidification. The first method cannot control the temperature gradient in this manner. Therefore, the second method of producing much taller ingots shown in FIGS. 5A-5E, which produces taller ingots than the first method, is better than the first method shown in FIGS. 4A-4C.

Accordingly, FIGS. 5A-5E show a casting process with 3-stage heater controls. The casting process moves the crucible downward during ingot growth, maintaining vertical temperature gradient to minimize intrinsic stresses in cast ingot. The view angle of the solidification front 500 from the top side heater 304 does not change throughout the casting process. Maintaining a constant vertical temperature gradient enables the cast ingot to be a taller near-net shape ingot.

Figure 6A:
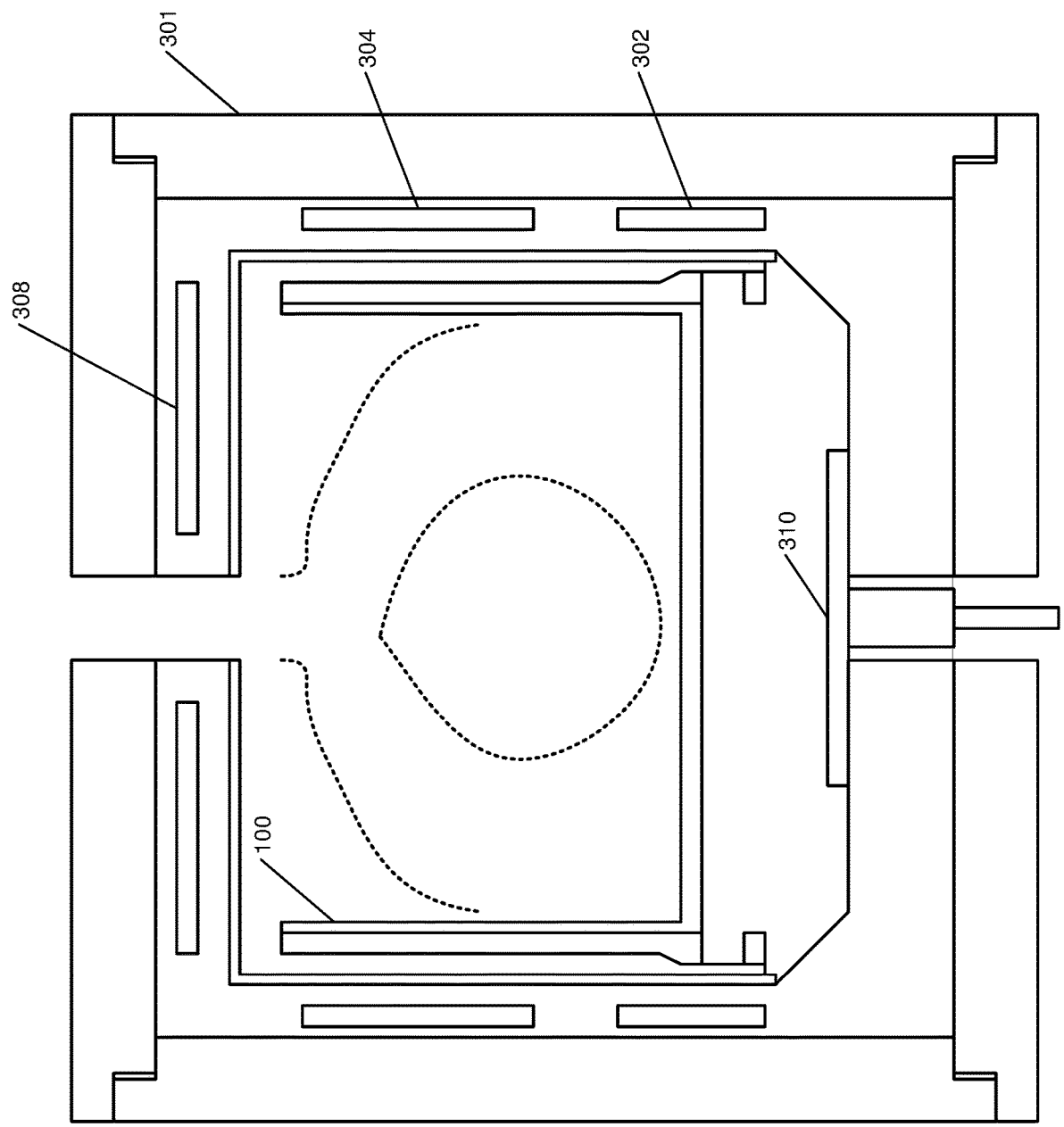
FIG. 6A shows temperature distributions in the feedstock during melting of silicon when the first crucible of FIGS. 1A-1B is used in the second furnace of FIG. 3B.
Figure 6B:
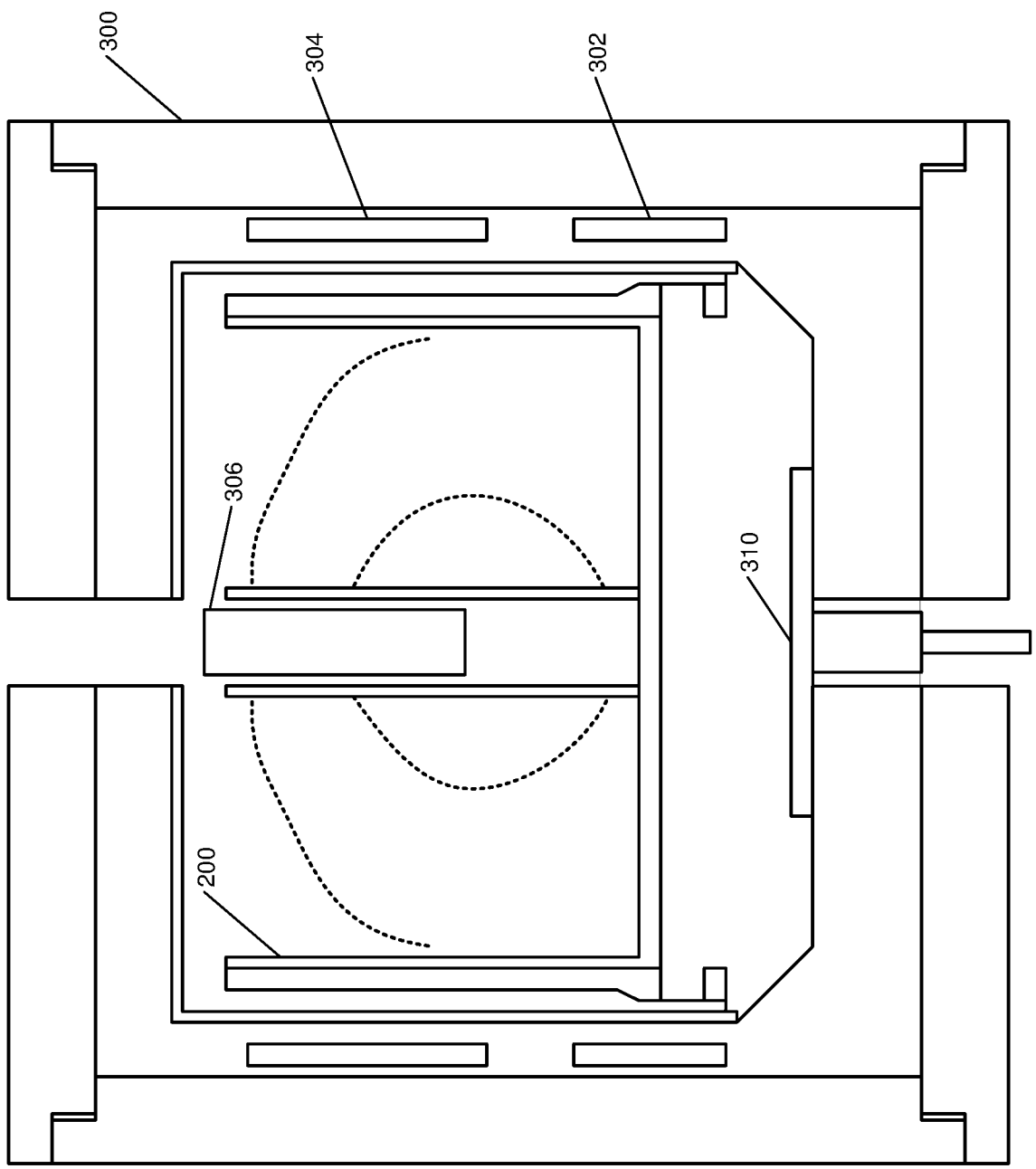
FIG. 6B shows temperature distributions in the feedstock during melting of silicon when the second crucible of FIGS. 2A-2B is used in the first furnace of FIG. 3A.

FIGS. 6A and 6B show the temperature distribution in the feedstock during the silicon melting process for the furnaces 301 and 300, respectively. FIG. 6A shows the temperature distribution for the furnace 301 with the cylindrical crucible 100 and the three heaters 302, 304, and 308. FIG. 6B show the temperature distribution for the furnace 300 with the cylindrical crucible 200 and the three heaters 302, 304, and 306.

Figure 7:
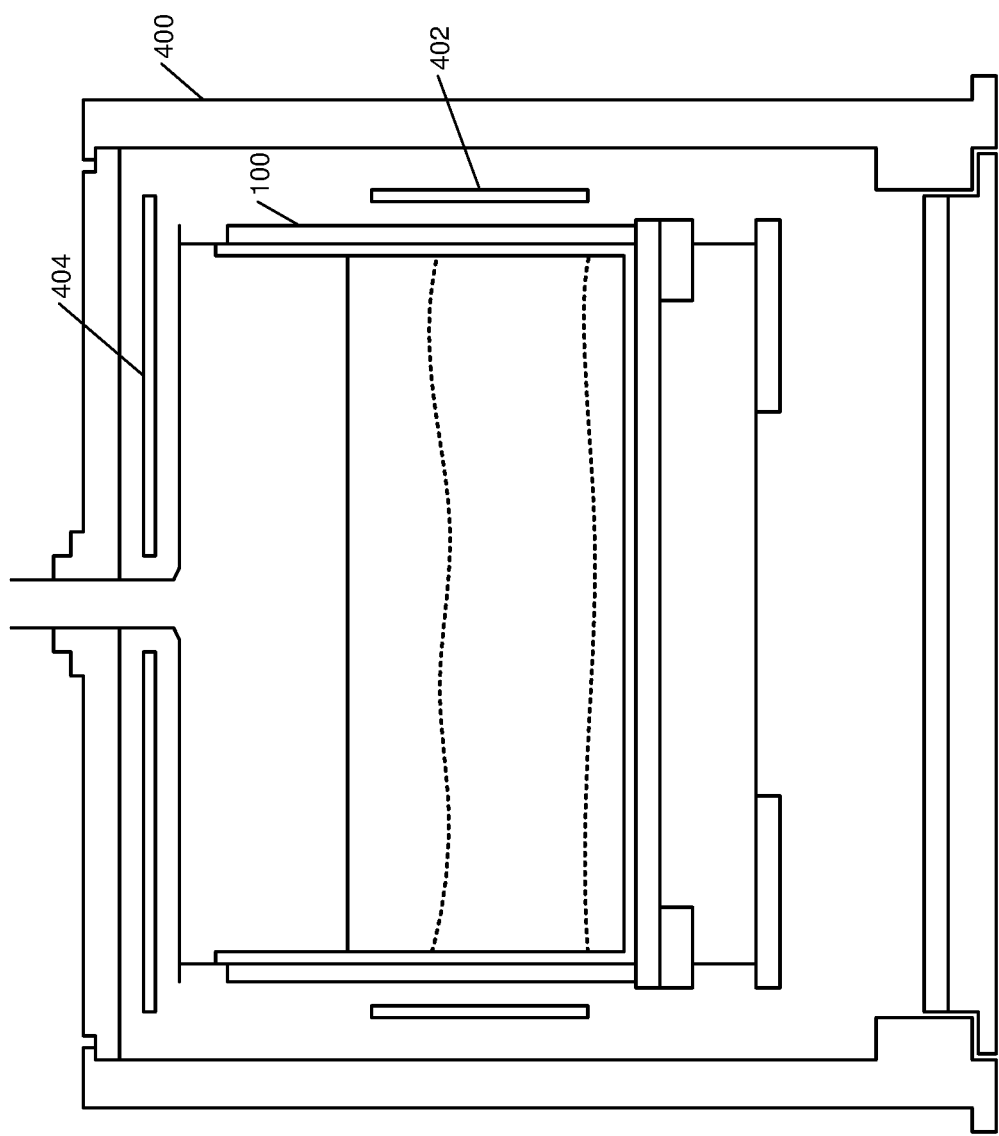
FIG. 7 shows temperature distributions in the feedstock during melting of silicon when the first crucible shown in FIGS. 1A-1B is used in the third furnace of FIGS. 4A-4C.

FIG. 7 shows the temperature distribution in the feedstock during silicon melting process for the furnace 400. FIG. 7 shows the temperature distribution for the furnace 400 with the cylindrical crucible 100 and the two heaters 402 and 404.

As shown in FIGS. 6A and 6B, the furnace (300, 301) has the ability to melt silicon in a uniform manner, which helps in avoiding overheating the crucible to well above the melting point of silicon for melting purposes. The three-stage heater design of the furnace (300, 301) has the ability to keep/maintain the temperatures along the side and bottom walls of the crucible (100, 200) without overheating the silicon for melting purposes. Avoiding overheating advantageously reduces defect levels (such as inclusions) in the cast silicon (the ingot).

In contrast, as shown in FIG. 7, the furnace 400 has a vertical temperature gradient. The furnace 400 does not have the ability to uniformly melt silicon. The heater design of the furnace 400 does not have the ability to keep/maintain the temperatures along the side and bottom walls of the crucible (100) without overheating the silicon for melting purposes. Due to overheating, the ingots produced in the furnace 400 have higher defect levels than those produced in the furnaces 300, 301.

FIG. 8 shows a method 800 for forming a hollow cylindrical ingot using the second cylindrical crucible of FIGS. 2A-2B in the first furnace of FIG. 3A and employing the second method of cooling molten silicon shown in FIGS. 5A-5C. The term control as used herein denotes instructions stored in a memory and executed by a processor of the controller (e.g., controller 314 shown in FIG. 3D).

At 802, a hollow cylindrical mold (e.g., cylindrical crucible 200 shown in FIGS. 2A-2B) is arranged on a pedestal in a furnace (e.g., furnace 300 shown in FIGS. 3A, 5D-5F, and 6B). At 804, a first heater (e.g., heater 306 shown in FIG. 3A) is arranged in a hollow cylindrical space in the mold in the furnace. At 806, second and third heaters (e.g., heaters 302, 304 shown in FIG. 3A) are vertically spaced along and around and outer wall of the mold in the furnace.

At 808, solid chunks of silicon are deposited in the mold. At 810, control operates the three heaters to melt the silicon in the mold as described above. At 812, control senses the temperature of the silicon in the mold. At 814, control operates the three heaters and rotates and lowers the pedestal at controlled speeds to cool the silicon in a controlled manner to form a hollow cylindrical ingot as described above.

FIG. 9 shows a method 900 for forming a solid cylindrical ingot using the first cylindrical crucible of FIGS. 1A-1B in the second furnace of FIG. 3B and employing the second method of cooling molten silicon shown in FIGS. 5D-5F. The term control as used herein denotes instructions stored in a memory and executed by a processor of the controller (e.g., controller 314 shown in FIG. 3D).

At 902, a solid cylindrical mold (e.g., cylindrical crucible 100 shown in FIGS. 1A-1B) is arranged on a pedestal in a furnace (e.g., furnace 301 shown in FIGS. 3B, 5A-5C, and 6A). At 904, a first heater (e.g., heater 308 shown in FIG. 3B) is arranged above the mold in the furnace. At 906, second and third heaters (e.g., heaters 302, 304 shown in FIG. 3B) are vertically spaced along and around and outer wall of the mold in the furnace.

At 908, solid chunks of silicon are deposited in the mold. At 910, control operates the three heaters to melt the silicon in the mold as described above. At 912, control senses the temperature of the silicon in the mold. At 914, control operates the three heaters and rotates and lowers the pedestal at controlled speeds to cool the silicon in a controlled manner to form a solid cylindrical ingot as described above.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. The controller may control various components or subparts of the system or systems. The controller, depending on the processing requirements and/or the type of system, may be programmed to control any of the processes disclosed herein.

Broadly speaking, the controller may be defined as electronics having various integrated circuits, logic, memory, and/or software that receive instructions, issue instructions, control operation, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process. The operational parameters may, in some embodiments, be part of a recipe defined by process engineers to accomplish one or more processing steps during the fabrication of one or more ingots described herein.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g., a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Accordingly, as described above, the controller may be distributed, such as by comprising one or more discrete controllers that are networked together and working towards a common purpose, such as the processes and controls described herein.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller in a semiconductor manufacturing factory.

The invention claimed is:
1. A furnace comprising:
  a hollow mold formed between an inner cylindrical wall and an outer cylindrical wall;
  a first heater arranged in a hollow cylindrical space extending along an inner wall of the inner cylindrical wall to heat pieces of a solid material deposited in the hollow mold;
  second and third heaters spaced vertically along an outer wall of the outer cylindrical wall and arranged around the outer cylindrical wall to heat the pieces of the solid material deposited in the hollow mold;
  a pedestal, with the hollow mold arranged on the pedestal, configured to rotate at a first speed and to move downward at a second speed relative to the first, second, and third heaters; and
  a controller configured to:
    control the first, second, and third heaters to heat the pieces of the solid material to form a melted liquid; and
    control the first and second speeds of the pedestal during solidification of the melted liquid to form an ingot from the melted liquid.
2. The furnace of claim 1 further comprising an insulation comprising:
  a circumference wall surrounding the outer cylindrical wall of the hollow mold;
  a top cover mounted on the circumference wall; and
  a bottom cover coupled to the pedestal and configured to move vertically with the pedestal.

3. The furnace of claim 1 wherein:
the inner cylindrical wall and the outer cylindrical wall are made of quartz; and
an inner portion of the outer cylindrical wall and an outer portion of the inner cylindrical wall are coated with silicon nitride.

4. The furnace of claim 1 wherein the solid material includes silicon, silicon carbide, or a non-oxide ceramic and wherein the solid material is selectively doped with a dopant.

5. The furnace of claim 1 further comprising:
at least one temperature sensor associated with the hollow mold to sense a temperature of contents of the hollow mold,
wherein the controller controls the first, second, and third heaters and the first and second speeds of the pedestal based on the sensed temperature.

6. A furnace comprising:
a cylindrical mold;
a cup surrounding the cylindrical mold;
a first heater arranged above the cylindrical mold to heat pieces of a solid material deposited in the cylindrical mold;
second and third heaters spaced vertically along an outer wall of the cup and arranged around the cup to heat the pieces of the solid material deposited in the cylindrical mold;
a pedestal, with the cylindrical mold arranged on the pedestal, configured to rotate at a first speed and to move downward at a second speed relative to the first, second, and third heaters; and
a controller configured to:
control the first, second, and third heaters to heat the pieces of the solid material to form a melted liquid; and
control the first and second speeds of the pedestal during solidification of the melted liquid to form an ingot from the melted liquid.

7. The furnace of claim 6 further comprising an insulation comprising:
a circumference wall surrounding the cup;
a top cover mounted on the circumference wall; and
a bottom cover coupled to the pedestal and configured to move vertically with the pedestal.

8. The furnace of claim 6 wherein:
the cylindrical mold is made of quartz;
the cup is made of graphite; and
an inner wall of the cylindrical mold is coated with silicon nitride.

9. The furnace of claim 6 wherein the solid material includes silicon, silicon carbide, or a non-oxide ceramic and wherein the solid material is selectively doped with a dopant.

10. The furnace of claim 6 further comprising:
at least one temperature sensor associated with the cylindrical mold to sense a temperature of contents of the cylindrical mold,
wherein the controller controls the first, second, and third heaters and the first and second speeds of the pedestal based on the sensed temperature.

11. A furnace comprising:
an insulation comprising:
a circumference wall;
a top cover mounted on the circumference wall; and
a bottom cover movable vertically relative to the circumference wall;
a pedestal coupled to the bottom cover, the pedestal being movable downwardly with the bottom cover and being rotatable;
a crucible arranged on the pedestal;
first and second heaters spaced vertically along an outer wall of the crucible and arranged around the crucible to heat pieces of solid material deposited in the crucible, the circumference wall surrounding the first and second heaters; and
a controller configured to:
control the first and second heaters to heat the pieces of the solid material to form a melted liquid; and
control rotational and downward movements of the pedestal relative to the first and second heaters during solidification of the melted liquid to form an ingot from the melted liquid.

12. The furnace of claim 11 wherein the crucible comprises a cylindrical mold surrounded by a cup.

13. The furnace of claim 12 wherein:
the cylindrical mold is made of quartz;
the cup is made of graphite; and
an inner wall of the cylindrical mold is coated with silicon nitride.

14. The furnace of claim 12 further comprising a third heater arranged above the crucible and controlled by the controller to heat the pieces of the solid material deposited in the crucible.

15. The furnace of claim 11 wherein the crucible comprises a hollow mold formed between an inner cylindrical wall and an outer cylindrical wall.

16. The furnace of claim 15 wherein:
the inner cylindrical wall and the outer cylindrical wall are made of quartz; and
an inner portion of the outer cylindrical wall and an outer portion of the inner cylindrical wall are coated with silicon nitride.

17. The furnace of claim 15 further comprising a third heater arranged in a hollow cylindrical space extending along an inner wall of the inner cylindrical wall and controlled by the controller to heat the pieces of the solid material deposited in the crucible.

18. The furnace of claim 11 wherein the solid material includes silicon, silicon carbide, or a non-oxide ceramic and wherein the solid material is selectively doped with a dopant.

19. The furnace of claim 11 further comprising:
at least one temperature sensor associated with the crucible to sense a temperature of contents of the crucible,
wherein the controller controls the first and second heaters and the rotational and downward movements of the pedestal based on the sensed temperature.

* * * * *